United States Patent
Fjelstad

(12) 
(10) Patent No.: US 6,417,029 B1
(45) Date of Patent: *Jul. 9, 2002

(54) COMPLIANT PACKAGE WITH CONDUCTIVE ELASTOMERIC POSTS

(75) Inventor: Joseph Fjelstad, Sunnyvale, CA (US)

(73) Assignee: Tessera, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/989,306

(22) Filed: Dec. 12, 1997

Related U.S. Application Data

(60) Provisional application No. 60/033,062, filed on Dec. 12, 1996.

(51) Int. Cl.[7] .................. H01L 21/44; H01L 21/48; H01L 21/50
(52) U.S. Cl. .................. 438/126; 438/106; 438/118; 438/125; 438/127
(58) Field of Search .................. 438/126, 125, 438/106, 127, 118

(56) References Cited

U.S. PATENT DOCUMENTS

| | | | |
|---|---|---|---|
| 5,074,947 A | 12/1991 | Estes et al. | 156/307.3 |
| 5,086,558 A | 2/1992 | Grube et al. | 29/832 |
| 5,148,265 A | 9/1992 | Khandros et al. | |
| 5,148,266 A | 9/1992 | Khandros et al. | |
| 5,183,711 A | 2/1993 | Wada et al. | |
| 5,196,371 A | 3/1993 | Gkuleza et al. | 437/183 |
| 5,237,130 A | 8/1993 | Kuleza et al. | 174/260 |
| 5,258,330 A | 11/1993 | Khandros et al. | 437/209 |
| 5,284,796 A * | 2/1994 | Nakanishi et al. | |
| 5,346,861 A | 9/1994 | Khandros et al. | 437/209 |
| 5,347,159 A | 9/1994 | Khandros et al. | 257/692 |
| 5,414,298 A | 5/1995 | Grube et al. | 257/690 |
| 5,455,390 A | 10/1995 | DiStefano et al. | 174/262 |
| 5,476,211 A | 12/1995 | Khandros | |
| 5,495,667 A | 3/1996 | Farnworth et al. | |
| 5,518,964 A | 5/1996 | DiStefano et al. | |
| 5,578,527 A | 11/1996 | Chang et al. | 437/209 |
| 5,627,405 A | 5/1997 | Chillara | |
| 5,636,104 A * | 6/1997 | Oh | |
| 5,651,179 A | 7/1997 | Bessho et al. | 29/832 |
| 5,657,206 A | 8/1997 | Pedersen et al. | 361/772 |
| 5,659,952 A * | 8/1997 | Kovac et al. | |
| 5,677,576 A | 10/1997 | Akagawa | |
| 5,749,997 A | 5/1998 | Tang et al. | 156/249 |
| 5,834,339 A | 11/1998 | Distenfano et al. | 438/125 |
| 5,858,806 A | 1/1999 | Nishida | 438/7 |
| 6,020,220 A | 2/2000 | Gelleo et al. | 438/119 |

* cited by examiner

*Primary Examiner*—Kevin M. Picardat
*Assistant Examiner*—Wael Fahmy
(74) *Attorney, Agent, or Firm*—Lerner, David, Littenberg, Krumholz & Mentlik, LLP

(57) ABSTRACT

A method of making a semiconductor chip assembly includes the steps of providing a semiconductor chip with contacts and a dielectric substrate wiring layer with terminals, forming a plurality of conductive elastomeric posts such that each post connects one terminal to one contact, and injecting a compliant material between the semiconductor chip and the dielectric substrate wiring layer to form a compliant layer.

Another method of making a semiconductor chip assembly includes the steps providing a semiconductor chip with contacts and a dielectric substrate wiring layer with terminals, dispensing a conductive elastomeric material over each of the contacts or over each of the terminals; juxtaposing the chip and the wiring layer such that conductive elastomeric material connects each of the contact to one of the terminals; injecting a compliant material between the chip and the wiring layer and around the conductive elastomeric material to form a compliant layer, and curing the conductive elastomeric material and the compliant material.

31 Claims, 3 Drawing Sheets

COMPLIANT PACKAGE WITH CONDUCTIVE ELASTOMERIC POSTS

CROSS REFERENCE TO RELATED APPLICATIONS

The present application claims benefit of U.S. Provisional Patent Application Ser. No. 60/033,062, filed on Dec. 12, 1996, the disclosure of which is hereby incorporated by reference herein.

FIELD OF THE INVENTION

The present invention relates to art of electronic packaging and more specifically to methods of making assemblies incorporating semiconductor chips.

BACKGROUND OF THE INVENTION

Modern electronic devices utilize semiconductor components; commonly referred to as "integrated circuits" which incorporate numerous electronic elements. These chips are mounted on substrates that physically support the chips and electrically interconnect each chip with other elements of the circuit. The substrate may be part of a discrete chip package, such as a single chip module or a multi-chip module, or may be a circuit board. The chip module or circuit board is typically incorporated into a large circuit. An interconnection between the chip and the chip module is commonly referred to as a "first level" assembly or chip interconnection. An interconnection between the chip module and a printed circuit board or card is commonly referred to as a "second level" interconnection.

The structures utilized to provide the first level connection between the chip and the substrate must accommodate all of the required electrical interconnection to the chip. The number of connections to external circuit elements, commonly referred to as "input-output" or "I/O" connections, is determined by the structure and function of the chip. Advanced chips capable of performing numerous functions may require substantial number of I/O connections.

The size of the chip and substrate assembly is a major concern. The size of each such assembly influences the size of the overall electronic device. Moreover, the size of each assembly controls the required distance between each chip and other chips, or between each chip and other elements of the circuit. Delays in transmission of electrical signals between chips are directly related to these distances. These delays limit the speed of operation of the device. For example, in a computer where a central processing unit operates cyclically, signals must be interchanged between the central processing unit chip and other chips during each cycle. The transmission delays inherent in such interchanges often limit the cycling rate of the central processing chip. Thus, more compact interconnection assemblies, with smaller distances between chips and smaller signal transmission delays can permit faster operation of the central processing chip.

The first level interconnection structures connecting a chip to chip module ordinarily are subject to substantial strain caused by thermal cycling as temperatures within the device change during operation. The electrical power dissipated with the chip tends to heat the chip and chip module, so that the temperatures of the chip and chip module rise each time the device is turned on and fall each time the device is turned off. Over a period of time, the device tends to undergo a number of heating up and cooling down cycles as the device is repeatedly turned on and off. These cycles, which cause an associated expansion and contraction of the device, are commonly referred to as "thermal cycling". As the chip and the chip modules are ordinarily are formed from different materials, having different coefficients of thermal expansion, the chip and the chip module ordinarily expand and contract by different amounts. This causes the electrical contacts on the chip to move relative to the electrical contact pads on the chip module as the temperature of the chip and the chip modules change. This relative movement deforms the electrical interconnections between the chip and the chip module and places them under mechanical stress. These stresses are applied repeatedly with repeated operations of the device, and can cause breakage of the electrical interconnections. Thermal cycling stresses may occur even where the chip and the chip module are formed from like materials having similar coefficients of thermal expansion, because the temperature of the chip may increase more rapidly than the temperature of the chip module when power is first applied to the chip.

In U.S. Pat. No. 5,627,405, which issued on May 6, 1997, Chillara discloses an integrated circuit assembly comprising an integrated circuit, a dielectric substrate and an anisotropic electrically conductive layer interposed between the dielectric substrate and the integrated circuit. The anisotropic electrically conductive layer is electrically conductive in directions that are parallel to an electrically conductive axis and is electrically insulative in other directions.

Commonly assigned U.S. Pat. Nos. 5,148,265; 5,148,266; 5,518,964; and 5,659,952; and commonly assigned U.S. patent application Ser. No. 08/709,470 filed on Sep. 5, 1996, the specifications of which are incorporated by reference herein, provide substantial solutions to the problems of thermal stresses. Nonetheless, alternative methods of addressing these problems are desired.

SUMMARY OF THE INVENTION

The present invention relates to methods of making semiconductor chip assemblies having conductive elastomer posts. The method of one aspect of the invention includes the steps of: providing a semiconductor chip having a plurality of contacts and a dielectric substrate wiring layer having a plurality of terminals on its first surface. A conductive elastomeric material is dispensed over each of the contacts, and/or each of the terminals. The dielectric substrate wiring layer and the semiconductor chip are then juxtaposed so that when the conductive elastomeric material is cured to form a plurality of conductive elastomeric posts, each of the posts has a contact end connected to one of the contacts and a terminal end connected to one of the terminals. A compliant material is then injected between the semiconductor chip and the dielectric substrate wiring layer to form a compliant layer. The conductive elastomeric material may be cured either before or after the injecting step.

In an alternative embodiment, the conductive elastomeric material is dispensed on the contacts on the semiconductor chip and then cured to form conductive elastomeric posts. In preferred embodiments, the posts are planarized. The posts may be planarized during or after cure. Each of the posts has a contact end connected to one of the contacts and a terminal end opposite the contact end. The terminal ends of the posts are then bonded to the terminals on the dielectric substrate wiring layer. A complaint material is injected between the semiconductor chip and the dielectric substrate wiring layer and around the conductive elastomeric posts. The compliant material is cured to form a compliant layer.

In an another embodiment, the conductive elastomeric material is dispensed on the terminals on the dielectric substrate wiring layer and then cured to form conductive elastomeric posts. In preferred embodiments, the posts are planarized either during or after cure. Each of the posts has a terminal end connected to one of the terminals and a contact end opposite the terminal end. The contact ends of the posts are then bonded to the contacts on the semiconductor chip. Then, a complaint material is injected between the semiconductor chip and the dielectric substrate wiring layer and around the conductive elastomeric posts. The compliant material is cured to form a compliant layer.

The methods of the present invention may further include the step of forming a plurality of joining units, such as a plurality of solder balls, on the bottom surface of the dielectric substrate wiring layer. Each of the solder balls should be electrically connected to one of the terminals, typically with an electrically conductive trace. The dielectric substrate wiring layer may have a plurality of apertures and each of the solder balls may be disposed in one of the apertures. The assembly can be connected to an external circuit, such as a printed circuit board using the plurality of joining units.

DETAILED DESCRIPTION OF THE PREFERRED EMBODIMENTS

Figure 1A:
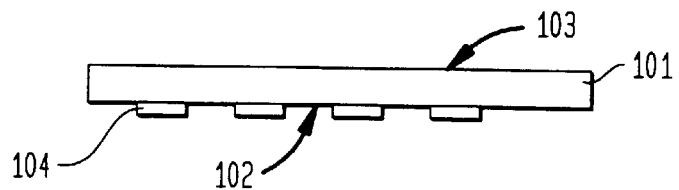
FIGS. 1A–1D are side views of a semiconductor chip assembly made in accordance with the method of the present invention.
Figure 1B:
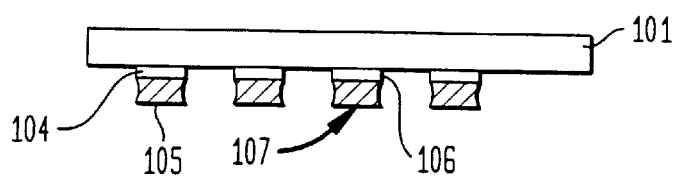

A method for making a semiconductor chip assembly in accordance with the present invention is depicted in FIG. 1A–1D. As depicted in FIG. 1A, a semiconductor chip 101 having a top surface 102 and bottom surface 103, and a plurality of contacts 104 is provided. As depicted in FIG. 1B, conductive elastomeric material is dispensed on each of the contacts 104 to form a plurality of conductive elastomeric posts 105. The conductive elastomeric material may be cured before it is applied to the contacts, immediately after it is applied to the contacts or later in the process of making the semiconductor chip assembly of the present invention.

The conductive elastomeric material is typically comprised of an elastomer matrix and conductive particles. Preferred elastomeric matrices include silicone elastomers, flexiblized epoxies, thermoplastic materials and other low modulus polymer blends. The electrically conductive particles may be spherical or irregularly shaped. The particles may be solid or hollow, and are typically made from a single conductive material. The particles may however contain a nonconductive center that is coated with a conductive material. In preferred embodiments, the conductive material is a highly conductive, low contract resistant metal. The preferred conductive materials are silver and gold.

Figure 1C:
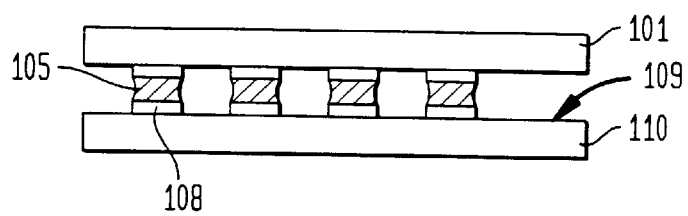

Each of the conductive elastomeric posts 105 has a contact end 106 connected to one of the contacts 104 and a terminal end 107 opposite the contact end. As depicted in FIG. 1C, the terminal ends of the conductive elastomeric posts 105 are abutted against a plurality of terminals 108 which are disposed on first surface 109 of a dielectric substrate wiring layer 110. If the conductive elastomeric material is fully cured when the before the terminal ends of the conductive elastomeric posts are connected to the terminals, the terminal ends will need to bonded to the terminals using an adhesive. If the conductive elastomeric material is an adhesive and is uncured or only partially cured when the terminal ends of the conductive elastomeric posts are connected to the terminals, then an adhesive may not be necessary. In preferred embodiments, each contact and each terminals is electrically conductive. In preferred embodiments, each contact is associated with one and only one of the terminals. Preferably, one and only one conductive elastomer post connects each contact with the associated terminal.

Preferably some, and more preferably all, of the terminals are disposed in a n area of the dielectric substrate wiring layer that lies directly below the semiconductor chip. The terminals are typically made of gold plated copper and are formed using additive and subtractive processes such as plating and etching. A typical semiconductor chip assembly will contact from 2 to thousands of terminals, more typically 2 to 50 terminals.

The dielectric substrate wiring layer preferably is a thin, flexible sheet of a polymeric material such as polyimide, a fluoropolymer, a thermoplastic polymer or an elastomer. The dielectric substrate wiring layer may have one or more apertures, extending from the first surface of the dielectric substrate wiring layer to the bottom surface. The dielectric substrate wiring layer is flexible to facilitate movement of the contacts of the semiconductor chip relative to the terminals and thus to contribute to the ability of the assembly to withstand thermal cycling.

Figure 1D:
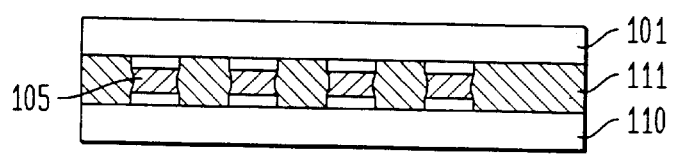

As depicted in FIG. 1D, a complaint material is injected between the semiconductor chip and the dielectric substrate wiring layer and around the conductive posts to form a compliant layer 111. The compliant layer is comprised of a dielectric material having a low modulus of elasticity, such as an elastomeric material. Preferred elastomeric materials include silicones, flexiblized epoxies, and thermoplastics. Silicone elastomers are particularly preferred. The elastic and thermal expansion properties of the cured compliant material may be similar to the properties of the conductive elastomeric material included in posts 105.

In a preferred embodiment of the method of the present invention, the dielectric substrate wiring layer has a plurality of apertures and the assembly also a plurality of joining units. The joining units are preferably disposed on the second surface of the dielectric substrate layer and are electrically connected to the plurality of terminals. Preferred joining units are solder balls. In preferred embodiments, each of the solder balls is disposed within one of the apertures and is electrically connected to one of the terminals with an electrically conductive trace. A semiconductor chip assembly made in accordance with the method of the present invention can be incorporated into a larger assembly, such as a printed circuit board using the plurality of joining units.

Figure 2A:
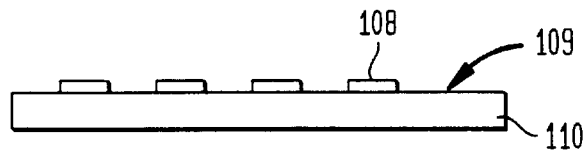
FIGS. 2A–2D are side views of a semiconductor chip assembly made in accordance with another method of the present invention.
Figure 2B:
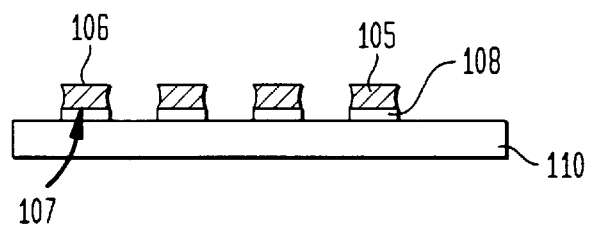
Figure 2C:
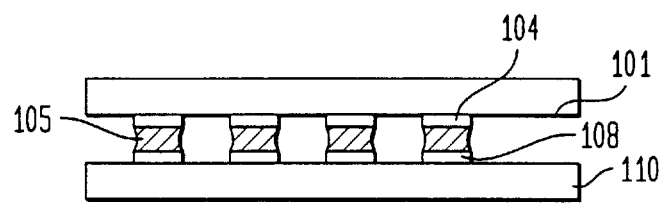
Figure 2D:
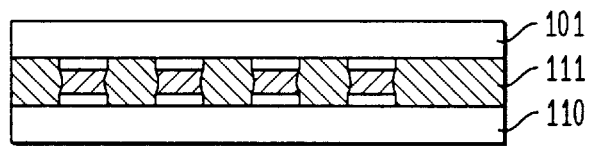

A semiconductor made in accordance with another method of the present invention is depicted in FIGS. 2A–2D. As depicted in FIG. 2A, a dielectric substrate wiring layer 110 having a first surface 109 and a plurality of terminals 108 is provided. As depicted in FIG. 2B, a conductive elastomeric material is disposed on each of the terminals to form a plurality of conductive elastomeric posts 105. Each post has a terminal end 107 connected to one of the terminals 8. As depicted in FIG. 2C, the contact ends 106 of the conductive elastomeric posts 105 are abutted against the contacts 104. If the conductive elastomeric material is cured before he contact ends are abutted, the contact ends should be bonded to the contacts using an adhesive. If the conductive elastomeric material is an adhesive and is uncured, an adhesive may not be needed to bond the contacts ends to the contacts. As depicted in FIG. 2D, a compliant material is injected between the semiconductor chip and the dielectric substrate wiring layer and around the conductive elastomeric posts to form a compliant layer 111.

In an alternative embodiment of the method of the present invention, conductive elastomeric material may be dispensed on both the contacts and the terminals. The semiconductor chip and the dielectric substrate wiring layer can be juxtaposed to connect the conductive elastomeric material on the terminals and the contacts such that when the conductive elastomeric material is cured, a plurality of conductive elastomeric posts are formed. Each of the posts has a terminal end connected to a terminal and a contact end opposite the terminal end which is connected to one of the contacts. A complaint material is injected between the semiconductor chip and the dielectric substrate and around the conductive elastomeric posts to form a compliant layer.

Figure 3:
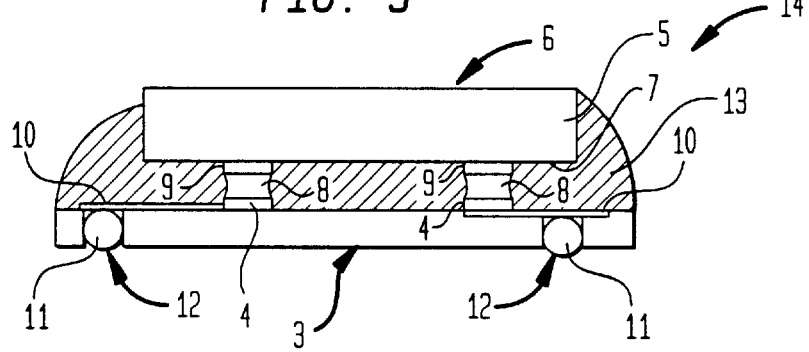
FIG. 3 is a diagrammatic section view depicting a semiconductor chip assembly made in accordance with another embodiment of the present invention.

A semiconductor chip assembly made according to the present invention preferably is adapted such that it can be electrically interconnected to and physically connected to a substrate. One such preferred embodiment is depicted in FIG. 3. In the embodiment of FIG. 3, the dielectric substrate wiring layer 1 that is described above, further comprises a plurality of apertures 12. Each aperture 12 corresponds to one of said terminals 4. Assembly 14 further comprises a plurality of solder balls 11, which act as a second level connecting means. Each solder ball 11 is disposed in one of the apertures 12. Each solder ball 11 must be electrically interconnected to one of the terminals via a first level connecting means. In FIG. 3, the first level connecting means includes a plurality of conductor traces 10. Each conductor trace 10 electrically connects one of a plurality of solder balls 11 to one of a plurality of terminals 4.

In order to incorporate semiconductor chip assembly 14 of FIG. 3 into a microelectronic device, the assembly must be electrically interconnected to, and physically connected to a substrate, such as a printed circuit board. One method of connecting the assembly is through the solder balls. Each solder ball 11 is heated until it reflows. Each solder ball 11 is brought into contact with one of a plurality of connection pads on a substrate. The solder is then allowed to resoldify to electrically interconnect and physically connect each solder ball 11 to one of a plurality of connection pads on a substrate.

In another embodiment of the present invention, a compliant layer 13, as depicted in FIG. 3, is incorporated into the assembly 14. Compliant layer 13 is disposed between the first surface 2 of dielectric substrate wiring layer 1 and bottom surface 7 of semiconductor chip 5. Compliant layer 13 comprises a dielectric material having a low modulus of elasticity, such as an elastomeric material. Preferred elastomeric materials include silicones, flexiblized epoxies, and thermoplastics. Silicone elastomers are particularly preferred. Compliant layer 13 also includes further portions of the compliant material extending upwardly alongside chip 6, towards the surface 6 of chip 5 remote from the dielectric substrate wiring layer 1. The compliant layer thus serves as an encapsulant for the assembly.

Figure 4:
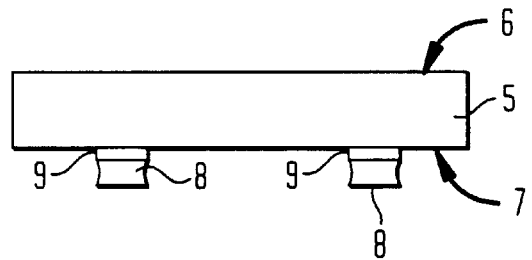
FIG. 4 is a diagrammatic section view depicting a connection element for use in the method of the present invention.

A connection element for a semiconductor chip assembly in accordance with one embodiment of the present aspect of the invention is depicted in FIG. 4. The connection element of this aspect of the invention includes a semiconductor chip 5 having a bottom surface 7. The connection element further includes a plurality of contacts 9 disposed on the second surface, and a plurality of conductive elastomeric posts 8. Each of the contacts 9 is associated with one of the posts 8, and connected to such associated post 8.

Figure 5:
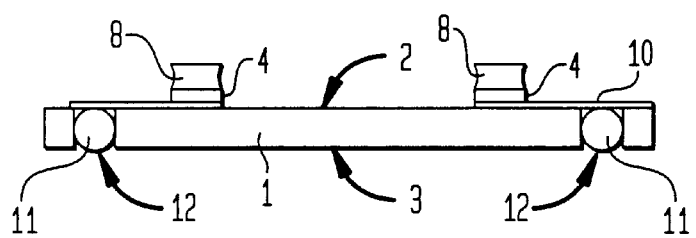
FIG. 5 is a diagrammatic section view depicting a connection component for use in another method of the present invention.

A connection component for a semiconductor chip assembly in accordance with another embodiment of the present aspect of the invention is depicted in FIG. 5. The connection component of this aspect of the invention includes a dielectric substrate wiring layer 1 having a first surface 2, a second surface 3 opposite the first surface 2, and a plurality of apertures 12. The connection component further includes a plurality of joining units. When the connection component is connected to an external circuit such as a printed circuit board, the joining units are used to electrically and physically connect the connection component to connection pads on the external circuit. The joining units depicted in FIG. 5 are solder balls 11. Each of the solder balls in disposed in one of the plurality of apertures 12. The connection component of this aspect of the invention further includes a plurality of terminals 4 disposed on the first surface 2 of the dielectric substrate wiring layer 1. The connection component also includes a plurality of conductive elastomeric posts 8. Each post 8 is associated with one of the plurality of terminals 4. The plurality of posts 8 are connected to the plurality of terminals 4 via a first level connecting means, such that each post 8 is electrically connected to the associated terminal 4. The first level connection means depicted in FIG. 5 is a plurality of conductor traces 10. Alternatively or additionally, the first level connection means or traces 10 may interconnect some of the posts with other posts, rather than with terminals, so that the traces interconnect elements of the chip with one another when a chip is mounted on the posts. In a further variant, the connection component may include additional electrical devices such as capacitors, resistors, inductors or additional semiconductor chips, and the traces may interconnect the posts with these elements or with additional posts or other mountings on substrate 1 adapted to hold such additional electrical elements.

Figure 6:
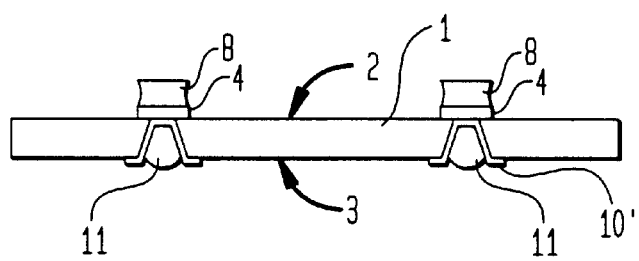
FIG. 6 is a diagrammatic section view depicting a connection component for use in another embodiment of the present invention.

Another first level connection means is depicted in FIG. 6. The connection component for use in the method of the present aspect of the invention is a plurality of plated vias 10'.

Figure 7:
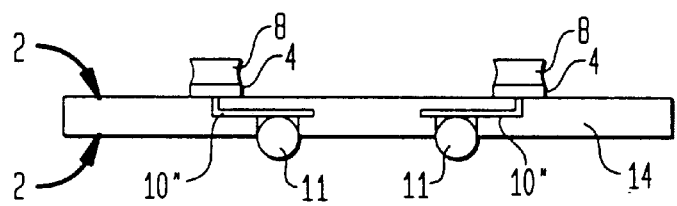
FIG. 7 is a diagrammatic section view depicting a connection component for use in another embodiment of the present invention.

Another first level connection means is depicted in FIG. 7. The connection component for use in the method of the present aspect of the invention includes a dielectric substrate wiring layer 1 having a first surface 2 and a second surface 3 opposite the first surface 2 The connection component further includes a plurality of terminals 4 disposed on the first surface 2, and a plurality of conductive elastomer posts 8. Each post 8 is associated with one of the terminals 4 and is disposed on such terminal 4. The connection component further includes a plurality of joining units. The plurality of joining units are used when the connection component is incorporated into an external circuit such as a printed circuit board. When the connection component is incorporated into an external circuit, each joining unit is electrically and physically connected to one of a plurality of connection pads on the substrate of such external circuit. In FIG. 7, the joining units are solder balls 11. The dielectric substrate wiring layer of this aspect of the invention has a multi-layered construction. It includes a dielectric layer 14 and a plurality of conductive layers or internal traces 10". Each conductive layer or internal trace 10" acts as a first level connecting means between one of the terminals 4 and the associated post 8.

Another method of the present invention comprises the step of abutting the contacts of a semiconductor chip to any of the connection components described above and injecting a compliant material between the semiconductor chip and the dielectric substrate wiring layer and around the conductive elastomeric posts. The compliant material is then cured or at least partially cured to form a compliant layer.

Another method of the present invention comprises the steps of abutting the terminals of a dielectric substrate wiring layer to the contacts of any of the connecting elements described above and injecting a compliant material between the semiconductor chip and the dielectric substrate wiring layer and around the conductive elastomeric posts. The compliant material is then cured or at least partially cured to form a compliant layer.

The semiconductor chip of the present invention can be replaced with another "microelectronic element". The term "microelectronic element" as used herein, refers to and includes single semiconductor chips, a plurality of individual semiconductor chips, a plurality of interconnected semiconductor chips and wafers. The plurality of interconnected chips may be in the form of a multichip module. In preferred low cost embodiments of the present invention, the microelectronic element is a single semiconductor chip.

As these and other variation and combinations of the features discussed above can be utilized without departing from the present invention as defined in the claims, the foregoing description of the preferred embodiments should be taken as illustrating, rather than limiting, the invention as claimed.

What is claimed is:

1. A method of manufacturing a semiconductor chip assembly, said method comprising the steps of:
   A. providing a dielectric substrate wiring layer having a first surface and a plurality of terminals disposed on the first surface;
   B. providing a semiconductor chip having a top surface and a plurality of contacts disposed on the top surface;
   C. forming a plurality of conductive elastomeric posts which connect each of the contacts to one of the terminals; and
   D. injecting a compliant material between the first surface of the dielectric substrate wiring layer and the top surface of the semiconductor chip to form a compliant layer.

2. The method of claim 1, wherein the dielectric substrate wiring layer is flexible.

3. The method of claim 2, wherein the dielectric substrate wiring layer is comprised of polyimide.

4. The method of claim 1, wherein said conductive post forming step comprises the steps of:
   C1. dispensing a conductive elastomeric material on each of the conductive terminals; and
   C2. juxtaposing the first surface of the dielectric substrate wiring layer and the top surface of the semiconductor chip such that when the conductive elastomeric material is cured, a conductive elastomeric post, having a contact end connected to one of the contacts and a terminal end connected to one of the terminals, is formed.

5. The method of claim 4, further comprising the steps of:
   curing the conductive elastomeric material; and
   curing the compliant material.

6. The method of claim 5, wherein the conductive elastomeric material curing step and the compliant material curing step are conducted simultaneously.

7. The method of claim 5, wherein the conductive elastomeric material curing step is conducted before the compliant material curing step.

8. The method of claim 5, wherein the conductive elastomeric material curing step is conducted prior to the juxtaposing step.

9. The method of claim 8, further comprising the step of bonding the contact end of each conductive post to one of the contacts.

10. The method of claim 8, further comprising the step of planarizing the conductive elastomeric posts prior to conducting the juxtaposing step.

11. The method of claim 1, wherein said conductive post forming step comprises the steps of:
   C1. dispensing a conductive elastomeric material on each of the contacts; and
   C2. juxtaposing the first surface of the dielectric substrate wiring layer and the top surface of the semiconductor chip such that when the conductive elastomeric material is cured, a conductive elastomeric post, having a contact end connected to one of the contacts and a terminal end connected to one of the terminals, is formed.

12. The method of claim 11, further comprising the steps of:
   curing the conductive elastomeric material; and
   curing the compliant material.

13. The method of claim 12, wherein the conductive elastomeric material curing step and the compliant material curing step are conducted simultaneously.

14. The method of claim 12, wherein the conductive elastomer material curing step is conducted prior to the juxtaposing step.

15. The method of claim 14, further comprising the step of bonding the terminal end of each conductive elastomeric post to one of the terminals.

16. The method of claim 12, wherein the conductive elastomeric material curing step is conducted before the compliant material curing step.

17. The method of claim 16, further comprising the step of planarizing the conductive elastomeric posts prior to conducting the juxtaposing step.

18. The method of claim 16, wherein
   the dielectric substrate wiring layer has a second surface opposite the first surface;
   the semiconductor chip has a bottom surface opposite the top surface surface;
   the planarizing step comprises the steps of
      engaging a first flat platen with the second surface of the dielectric substrate wiring layer;
      engaging a second flat platen with the bottom surface of the semiconductor chip; and
      compressing the first flat platen and the second flat platen such that the conductive elastomeric material is compressed between the contacts and the terminals; and said method of making a semiconductor chip assembly further comprises the step releasing the compressed first and second flat platens after the injecting step and ant the compliant material curing step.

19. The method of claim 1, wherein each contact is associated with one and only one of the terminals and wherein each conductive elastomeric post connects one of the contacts to the associated terminal.

20. The method of claim 19, wherein each contact and the associated terminal form a contact-associated terminal pair and wherein said conductive post forming step comprises the steps of:

C1. dispensing a conductive elastomeric material on at least some of the contacts and on at least some of the terminals such that for each contact-associated terminal pair some conductive elastomeric material is dispensed on the contact, the associated terminal, or on both the contact and the associated terminal; and C2. juxtaposing the first surface of the dielectric substrate wiring layer and the top surface of the semiconductor chip such that when the conductive elastomeric material is cured, a conductive elastomeric post, having a contact end connected to one of the contacts and a terminal end connected to one of the terminals, is formed.

21. The method of claim 20, further comprising the steps of:

curing the conductive elastomeric material; and
curing the compliant material.

22. The method of claim 21, wherein the conductive elastomeric material curing step and the compliant material curing step are conducted simultaneously.

23. The method of claim 22, wherein the conductive elastomeric material curing step is conducted before the compliant material curing step.

24. The method of claim 23, further comprising the step of planarizing the conductive elastomeric posts prior to conducting the conductive elastomeric material curing step.

25. The method of claim 24, wherein the dielectric substrate wiring layer has a second surface opposite the first surface;

the semiconductor chip has a bottom surface opposite the top surface;

the planarizing step comprises the steps of
engaging a first flat platen with the second surface of the dielectric substrate wiring layer;
engaging a second flat platen with the bottom surface of the semiconductor chip; and
compressing the first flat platen and the second flat platen such that the conductive elastomeric material is compressed between the contacts and the terminals; and said method of making a semiconductor chip assembly further comprises the step releasing the compressed first and second flat platens after the injecting step and ant the compliant material curing step.

26. A method of manufacturing a semiconductor chip assembly, said method comprising the steps of:

A. providing a dielectric substrate wiring layer having a first surface, a plurality of terminals disposed on the first surface, and conductive elastomeric material dispensed on each of the terminals;

B. providing a semiconductor chip having a top surface and a plurality of contacts disposed on the top surface;

C. juxtaposing the first surface of the dielectric substrate wiring layer and the top surface of the semiconductor chip such that each terminal is aligned with one of the contacts and each terminal and aligned contact are connected by conductive elastomeric material;

D. curing the conductive elastomeric material to form a plurality of conductive elastomeric posts, wherein each conductive elastomeric post has a contact end connected to a contact and a terminal end opposite the contact end which is connected to the associated terminal; and E. injecting a compliant material between the first surface of the dielectric substrate wiring layer and the top surface of the semiconductor chip and around the conductive elastomeric posts to form a compliant layer.

27. A method of manufacturing a semiconductor chip assembly, said method comprising the steps of:

A. providing a dielectric substrate wiring layer having a first surface and a plurality of terminals disposed on the first surface;

B. providing a semiconductor chip having a top surface, a plurality of contacts disposed on the top surface, and conductive elastomeric material dispensed on each of the contacts;

C. juxtaposing the first surface of the dielectric substrate wiring layer and the top surface of the semiconductor chip such that each terminal is aligned with one of the contacts and each terminal and aligned contact are connected by conductive elastomeric material;

D. curing the conductive elastomeric material to form a plurality of conductive elastomeric posts, wherein each conductive elastomeric post has a contact end connected to a contact and a terminal end opposite the contact end which is connected to the associated terminal; and E. injecting a compliant material between the first surface of the dielectric substrate wiring layer and the top surface of the semiconductor chip and around the conductive elastomeric posts to form a compliant layer.

28. The method of claim 1, wherein each conductive elastomeric post is comprised of a polymer.

29. The method of claim 1, wherein each conductive elastomeric post is comprised of an elastomer matrix and conductive particles.

30. The method of claim 29, wherein the elastomer matrix is a silicone elastomer or a flexibilized epoxy.

31. The method of claim 30, wherein the conductive particles are silver or gold.

* * * * *

UNITED STATES PATENT AND TRADEMARK OFFICE
CERTIFICATE OF CORRECTION

PATENT NO. : 6,417,029 B1
DATED : July 9, 2002
INVENTOR(S) : Joseph Fjelstad

It is certified that error appears in the above-identified patent and that said Letters Patent is hereby corrected as shown below:

Title page,
Item [57], ABSTRACT,
Line 15, "contact" should read -- contacts --.

Column 1,
Line 13, after "to" insert -- the --.
Line 35, "interconnection" should read -- interconnections --.

Column 2,
Line 3, delete "are" (second occurrence).
Line 9, "change" should read -- changes --.
Line 66, delete "an".

Column 3,
Line 51, "FIG." should read -- FIGS. --.

Column 4,
Line 13, delete "when the".
Line 20, "terminals" should read -- terminal --.
Line 26, "a n" should read -- an --.

Column 6,
Line 28, delete "in" and insert therefor -- is --.
Line 58, following "2" insert -- . --.

Column 7,
Line 34, "variation" should read -- variations --.

UNITED STATES PATENT AND TRADEMARK OFFICE
CERTIFICATE OF CORRECTION

PATENT NO. : 6,417,029 B1
DATED : July 9, 2002
INVENTOR(S) : Joseph Fjelstad

It is certified that error appears in the above-identified patent and that said Letters Patent is hereby corrected as shown below:

<u>Column 9,</u>
Lines 2 and 55, after "step" insert -- of --.
Lines 4 and 57, delete "ant".

Signed and Sealed this

Fourth Day of February, 2003

JAMES E. ROGAN
*Director of the United States Patent and Trademark Office*